(12) United States Patent  
Xu

(10) Patent No.: US 10,474,204 B2  
(45) Date of Patent: Nov. 12, 2019

(54) ELECTRICAL POWER SUPPLY EXPANSION CARD AND COMPUTER CASE

(71) Applicant: SHENZHEN ORICO TECHNOLOGIES CO., LTD., Shenzhen, Guangdong (CN)

(72) Inventor: Yeyou Xu, Guangdong (CN)

(73) Assignee: SHENZHEN ORICO TECHNOLOGIES CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/082,470

(22) PCT Filed: Apr. 19, 2017

(86) PCT No.: PCT/CN2017/081107  
§ 371 (c)(1),  
(2) Date: Sep. 5, 2018

(87) PCT Pub. No.: WO2018/040585  
PCT Pub. Date: Mar. 8, 2018

(65) Prior Publication Data  
US 2019/0094922 A1 Mar. 28, 2019

(30) Foreign Application Priority Data  
Aug. 30, 2016 (CN) .................... 2016 2 1007973 U

(51) Int. Cl.  
*G06F 1/18* (2006.01)  
*H05K 5/02* (2006.01)  
*G06F 1/26* (2006.01)

(52) U.S. Cl.  
CPC ............... *G06F 1/181* (2013.01); *G06F 1/18* (2013.01); *G06F 1/185* (2013.01); *G06F 1/186* (2013.01);  
(Continued)

(58) Field of Classification Search  
CPC .......... G06F 1/185; G06F 1/186; G06F 1/188; H05K 5/026  
(Continued)

(56) References Cited

U.S. PATENT DOCUMENTS 5,513,329 A * 4/1996 Pecone ................ G06F 13/409  
361/679.32  
5,666,267 A * 9/1997 Carter ..................... G06F 1/181  
361/627

(Continued)

FOREIGN PATENT DOCUMENTS

CN 101887295 A 11/2010  
CN 101943933 A 1/2011  
(Continued)

OTHER PUBLICATIONS

International Search Report for PCT/CN2017/081107, dated Jul. 15, 2017.

*Primary Examiner* — Adrian S Wilson  
(74) *Attorney, Agent, or Firm* — Merchant & Gould P.C.

(57) ABSTRACT

Disclosed are an electrical power supply expansion card and a computer case. The electrical power supply expansion card comprises a housing and a circuit board. The circuit board is arranged on the housing, and the housing is installed in the computer case. The circuit board is provided with at least one peripheral interface, and is further provided with at least one power source interface. The at least one power source interface is detachably connected to a power source in the computer case so as to obtain electric power and output electric power via the at least one peripheral interface. The technical solution provided in the present invention can enable the expansion card to be an expanded power source of the power source in the computer case, thus supplying power to an external device, thereby improving the usability of the expansion card.

12 Claims, 6 Drawing Sheets

(52) U.S. Cl.
CPC .............. *G06F 1/263* (2013.01); *G06F 1/266* (2013.01); *H05K 5/026* (2013.01)

(58) Field of Classification Search
USPC ........................................ 361/679.32, 679.45
See application file for complete search history.

(56) References Cited

U.S. PATENT DOCUMENTS

| | | | | |
|---|---|---|---|---|
| 6,216,184 B1* | 4/2001 | Fackenthall | ............ | G06F 1/181 710/301 |
| 6,247,078 B1* | 6/2001 | Ebert | ................. | H05K 7/20718 361/725 |
| 6,341,060 B1* | 1/2002 | Chuang | ................ | G11B 33/121 248/27.1 |
| 6,356,959 B1* | 3/2002 | Thomas | ................... | G06F 1/184 710/2 |
| 6,363,450 B1* | 3/2002 | Lash | ........................ | G06F 1/184 361/748 |
| 6,466,434 B1* | 10/2002 | Tsai | ........................ | G06F 1/184 360/99.18 |
| 6,889,280 B1* | 5/2005 | Barmore | ................ | G06F 13/409 710/1 |
| 7,929,290 B2 | 4/2011 | Sun | | |
| 2003/0210518 A1* | 11/2003 | Syring | ..................... | G06F 1/186 361/679.4 |
| 2006/0046534 A1* | 3/2006 | Birmingham | ............ | G06F 1/184 439/76.1 |
| 2006/0256515 A1* | 11/2006 | Watanabe | ................ | G06F 1/181 361/679.32 |
| 2008/0062667 A1* | 3/2008 | Campini | ................. | G06F 1/181 361/797 |
| 2008/0160790 A1* | 7/2008 | Orr | ......... | G06F 1/186 439/55 |
| 2008/0304223 A1* | 12/2008 | Franz | ...................... | G06F 1/185 361/737 |
| 2011/0007483 A1 | 1/2011 | Li et al. | | |
| 2014/0177161 A1* | 6/2014 | Chang | ................... | G06F 1/1613 361/679.32 |
| 2016/0246338 A1* | 8/2016 | Stavi | ........................ | G06F 1/20 |

FOREIGN PATENT DOCUMENTS

| | | |
|---|---|---|
| CN | 202735950 U | 2/2013 |
| CN | 106249825 A | 12/2016 |

* cited by examiner

ELECTRICAL POWER SUPPLY EXPANSION CARD AND COMPUTER CASE

This application is a U.S. National Stage Application under 35 U.S.C. § 371 of International Patent Application No. PCT/CN2017/081107, filed Apr. 19, 2017, which claims the benefit of Application No. 201621007973.9, filed Aug. 30, 2016 in China and which applications are incorporated herein by reference herein by reference. To the extent appropriate, a claim priority is made to each of the above-disclosed applications.

TECHNICAL FIELD

The present disclosure relates to the technical field of computer hardware, and in particular to an electrical power supply expansion card and a computer case.

BACKGROUND ART

At present, a computer case is generally provided therein with an expansion slot, via which a graphics card, a network card, and the like are installed in the computer case. These peripherals such as a graphics card and a network card that are installed in the computer case via an expansion slot are usually referred to as expansion cards. The prior expansion cards mostly contain a USB port, an audio port, etc., and are mostly used for data transmission, and cannot be used as a power supply device to supply power to peripherals plugged into the expansion cards, and thus have a limited range of application.

SUMMARY

The main object of the present disclosure is to provide an electrical power supply expansion card and a computer case (chassis), and the disclosure is intended to provide an electrical power supply expansion card, which can be used as an expanded power source of the power source in the computer case to supply power to an external device, thereby improving the usability of the expansion card.

In order to achieve the above object, an electrical power supply expansion card proposed in the present disclosure comprises a housing and a circuit board, wherein the circuit board is housed in the housing, and the housing is configured to be installed in a computer case; the circuit board is provided with at least one peripheral interface, the circuit board is further provided with at least one power source interface, and the at least one power source interface is detachably connected to a power source in the computer case so as to obtain electric power and output electric power via the at least one peripheral interface.

Preferably, the housing comprises a fixing insertion plate, wherein the fixing insertion plate and an output end of the at least one peripheral interface on a same side, and the at least one peripheral interface extends outward in a direction perpendicular to a plane of the fixing insertion plate.

Preferably, at least one end of the fixing insertion plate is provided with a mounting hole for allowing a screw to pass therethrough for fixing the expansion card to the computer case.

Preferably, the housing further comprises a cover plate which is installed on the circuit board by a fixer.

Preferably, an upper surface of the cover plate is provided with heat dissipating holes to dissipate heat from components on the circuit board.

Preferably, the expansion card is further provided with a reset switch, wherein the reset switch is arranged on the circuit board, and located adjacent to a position where the at least one peripheral interface is located, and protrudes from the plane of the fixing insertion plate.

Preferably, the at least one power source interface is a 4 pin peripheral connector, which is detachably connected to the power source in the computer case through a power line, so that the expansion card obtains electric power.

Preferably, the at least one peripheral interface is one or more of a DC port (connector), a TYPE-C port (connector), and a USB-A port (connector).

Preferably, the number of the at least one peripheral interface is two, and the two peripheral interfaces are DC ports for outputting different voltages, respectively.

The present disclosure also provides a computer case comprising any one of the electrical power supply expansion cards described above.

In the technical solution of the present disclosure, the expansion card comprises a housing and a circuit board, wherein the circuit board is housed in the housing, and the housing is configured to be installed in a computer case; the circuit board is provided with at least one peripheral interface, the circuit board is further provided with at least one power source interface, and the at least one power source interface is detachably connected to a power source in the computer case so as to obtain electric power and output electric power via the at least one peripheral interface. According to the technical solution provided in the present disclosure, the expansion card can be used as an extended power source of the power source in the computer case to supply power to an external device, thereby improving the usability of the expansion card.

BRIEF DESCRIPTION OF DRAWINGS

In order to more clearly illustrate embodiments of the present disclosure or the technical solutions in the prior art, drawings required for use in the description of the embodiments or the prior art will be introduced briefly below. It is obvious that the drawings in the following description are merely illustrative of some embodiments of the present disclosure. It would be understood by those of ordinary skill in the art that other drawings could also be obtained from structures shown in these drawings without any inventive effort.

DESCRIPTION OF REFERENCE NUMERALS

TABLE 1

Figure 1:
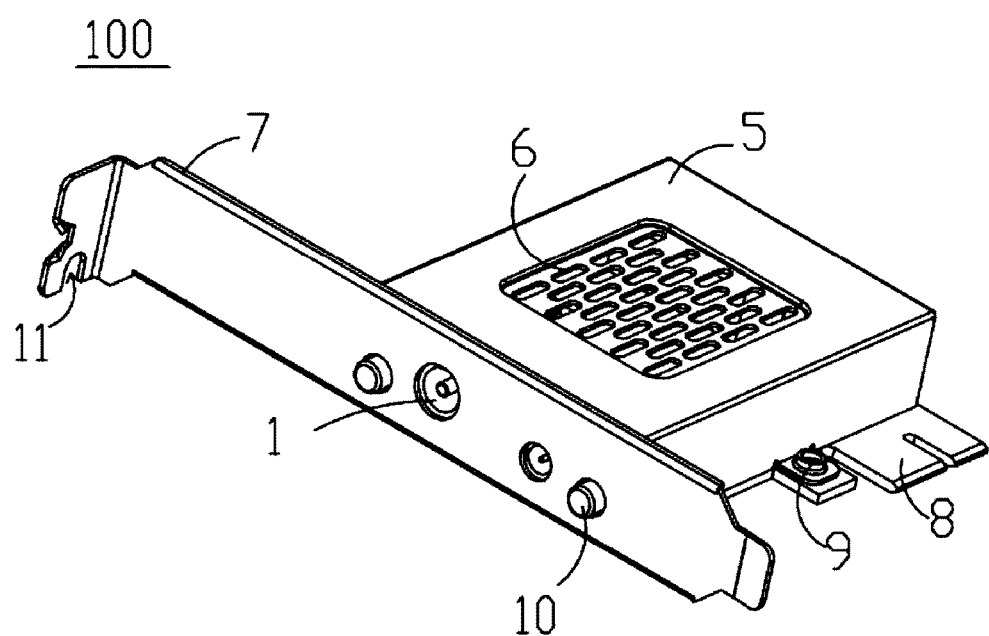
FIG. 1 is a schematic diagram of a first structure of an electrical power supply expansion card according to an embodiment of the present disclosure.
Figure 2:
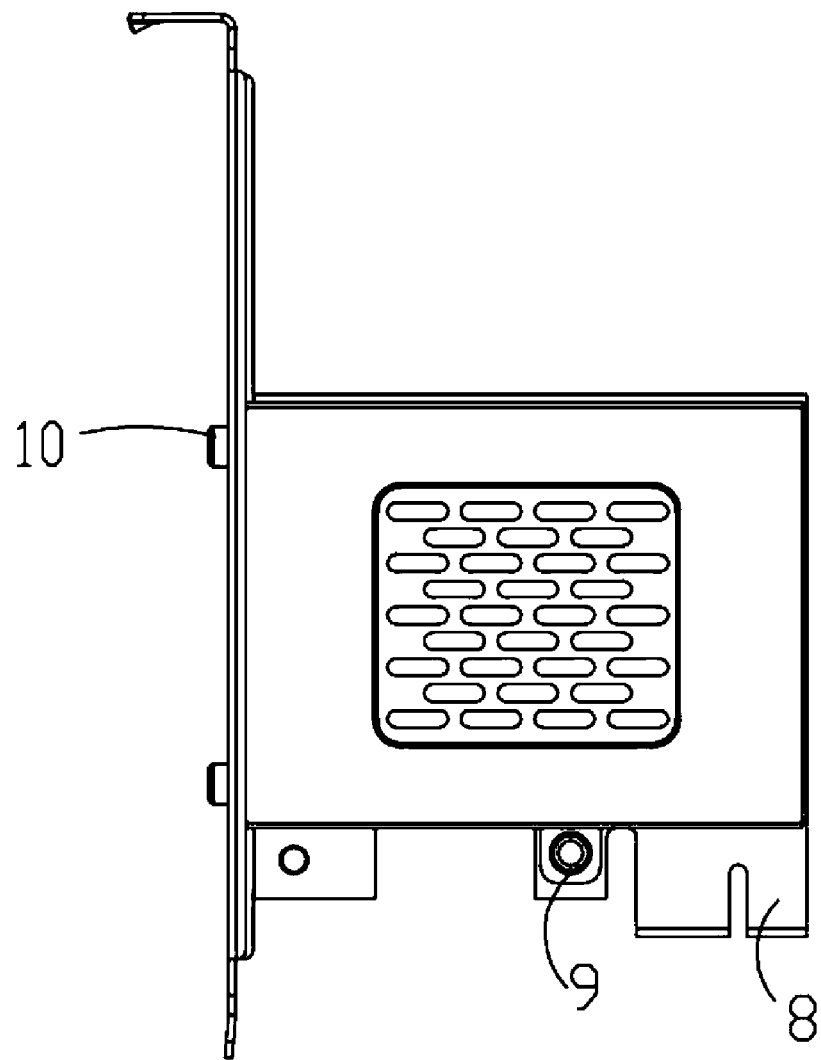
FIG. 2 is a top view of FIG. 1.
Figure 3:
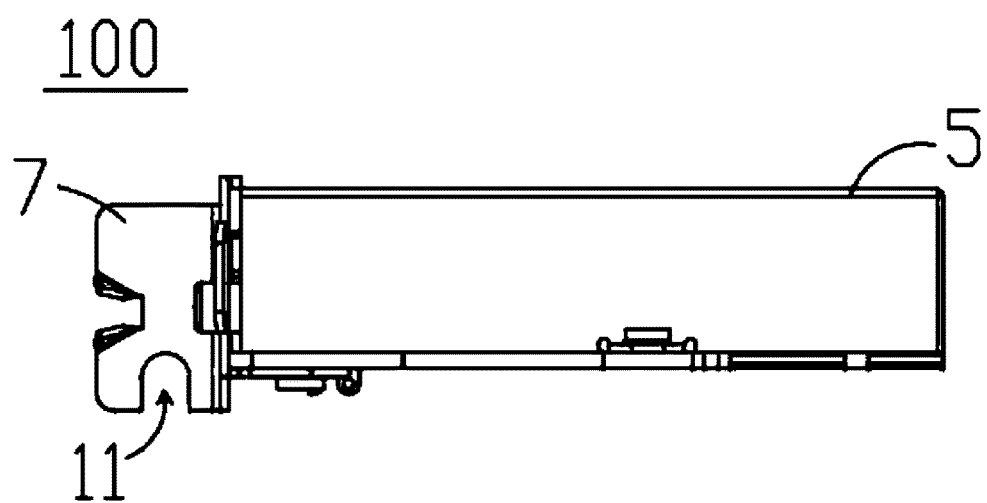
FIG. 3 is a front view of FIG. 2.
Figure 4:
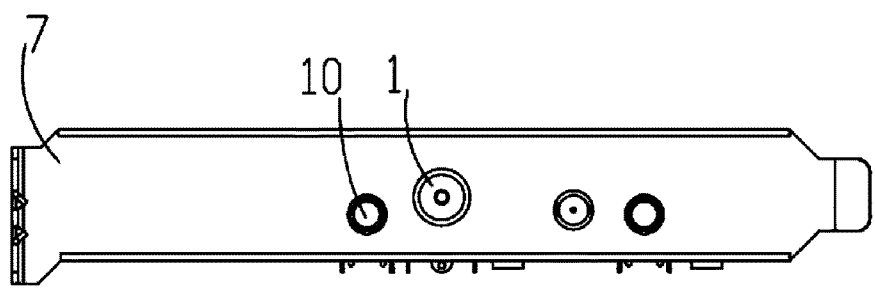
FIG. 4 is a left side view of FIG. 2.
Figure 5:
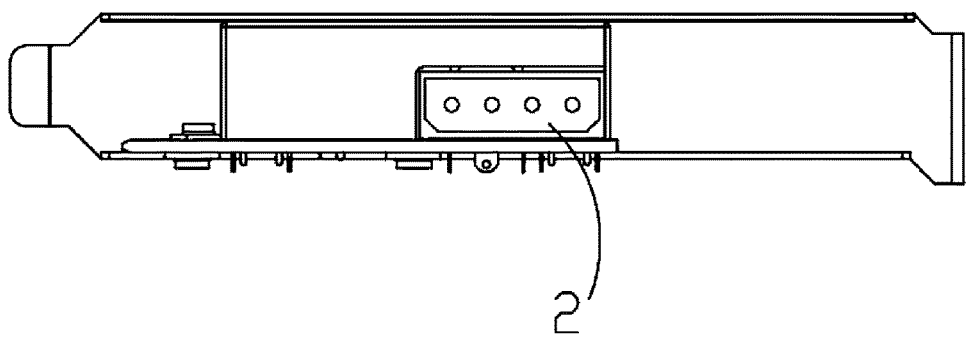
FIG. 5 is a right side view of FIG. 2.

| Reference Numeral | Name | Reference Numeral | Name |
| --- | --- | --- | --- |
| 100 | Expansion Card | 1 | DC port |
| 2 | 4 Pin Peripheral Connector | 5 | Cover Plate |
| 6 | Heat Dissipating Hole | 7 | Fixing insertion plate |
| 11 | Mounting Hole | 9 | Fixer |

TABLE 1-continued

| Reference Numeral | Name | Reference Numeral | Name |
|---|---|---|---|
| 10 | Reset Switch | 8 | Plug Connector |
| 3 | TYPE-C port | | |

The achievement of the object, functions, features, and advantages of the present disclosure will be further described with reference to the accompanying drawings in connection with the embodiments.

DETAILED DESCRIPTION OF EMBODIMENTS

The technical solutions of the embodiments of the present disclosure will be described below clearly and completely with reference to the drawings of the embodiments of the present disclosure. It is apparent that the embodiments to be described are some, but not all of the embodiments of the present disclosure. All the other embodiments obtained by those of ordinary skill in the art in light of the embodiments of the present disclosure without inventive efforts would fall within the scope of the present disclosure as claimed.

It should be noted that all directional indications (such as up, down, left, right, front, back, . . . ) in the embodiments of the present disclosure are only used to explain, for example, the relative positional relationship and the movement status between parts in a specific posture (as shown in the drawing), and if the specific posture changes, the directional indication also changes accordingly.

In addition, in the present disclosure, the descriptions referring to the terms such as "first", "second" and the like are used for descriptive purposes only, and are not to be construed as indicating or implying their relative importance or implicitly indicating the number of the indicated technical feature. Thus, a feature defined by the term "first" or "second" may explicitly or implicitly include at least one feature. In the description of the present disclosure, the term "multiple" means at least two, for example two, three, or the like, unless specifically defined otherwise.

In the description, terms such as "connect" and "fix" should be understood in a broad sense unless otherwise expressly specified or defined. For example, the "connection" may be fixed connection or detachable connection or integral connection, may be mechanical connection or electric connection, may be direct coupling or indirect coupling via an intermediate medium, or may be internal communication between two elements or interactive relationship between two elements. The specific meanings of the above-mentioned terms in the present disclosure could be understood by those of ordinary skill in the art according to specific situations.

In addition, the technical solutions of the various embodiments of the present disclosure may be combined with each other, but must be combined to be implementable by those of ordinary skill in the art, and a combination of the technical solutions should be considered to be not present and not within the scope of protection as claimed in the present disclosure when the combination of the technical solutions is contradictory or not implementable.

The present disclosure proposes an electrical power supply expansion card.

Referring to FIG. 1 to FIG. 7, the present disclosure provides an electrical power supply expansion card comprising a housing (not denoted) and a circuit board (not shown), wherein the circuit board is housed in the housing, and the housing is configured to be installed in a computer case; the circuit board is provided with at least one peripheral interface (not denoted), the circuit board is further provided with at least one power source interface (not denoted), and the at least one power source interface is detachably connected to a power source in the computer case so as to obtain electric power and output electric power via the at least one peripheral interface.

The expansion card 100 in the present embodiment is connected to the power source in the computer case via the at least one power source interface thereon, to obtain electric power from the power source in the computer case, and then is connected to an external device via the at least one peripheral interface on the expansion card 100 so as to supply power to the external device. As an electric power supply device, the expansion card 100 of the present embodiment can lead out electric power from the power source in the computer case and directly output the electric power to the external device to supply power to the external device, which is equivalent to expanding an external power source for the computer case, thereby increasing the usability of the expansion card so that it is used more conveniently.

Further, the housing in the present embodiment further comprises a fixing insertion plate 7, wherein the fixing insertion plate 7 and the at least one peripheral interface are on a same side, and the at least one peripheral interface extends outward in a direction perpendicular to a plane of the fixing insertion plate 7. Specifically, the external device is inserted into the at least one peripheral interface in a direction perpendicular to the plane of the fixing insertion plate 7 and is connected to the at least one peripheral interface via the fixing insertion plate 7. Preferably, at least one end of the fixing insertion plate is provided with a mounting hole 11 for allowing a screw to pass therethrough for fixing the expansion card 100 to the computer case.

Preferably, one side of the circuit board is provided with a plug connector 8, wherein the expansion card 100 is inserted into an expansion slot of a motherboard in the computer case via the plug connector 8. That is, the expansion card 100 can be directly inserted into PCI and PCEI expansion slots of the computer motherboard like other computer hardware such as a graphics card and a sound card. The plug connector 8 of the present embodiment mainly serves the function of further fixing the expansion card.

Specifically, during installation of the expansion card 100, firstly the plug connector 8 is inserted into an expansion slot on the motherboard, and the expansion card 100 is fixed by a buckle on the expansion slot, and then the expansion card 100 is screwed to the computer case by passing a screw on the computer case through the mounting hole on the fixing insertion plate 7, so that the expansion card 100 is more steady installed in the computer case.

Further, the expansion card 100 further comprises a cover plate 5, wherein the cover plate 5 is installed on the circuit board by a fixer 9. It can be understood that the cover plate 5 is mainly intended to provide a protective barrier for components on the circuit board. Preferably, the cover plate 5 is provided with heat dissipating holes 6 to dissipate heat from components on the circuit board. The heat dissipating holes 6 are designed as needed, and a number of heat dissipating holes 6 may also be designed around the cover plate to timely dissipate heat from the components on the circuit board.

Further, the circuit board comprises an overload protection module (not shown).

Arranging an overload protection module on the circuit board can improve the safety of a device to be charged during charging.

Further, the circuit board further comprises a short-circuit protection module (not shown).

Arranging a short-circuit protection module on the circuit board can further improve the safety of the device to be charged during charging.

Further, there are multiple peripheral interfaces, each of which can be used as a charging interface. Preferably, one of the multiple peripheral interfaces may be a DC port 1 and/or a TYPE-C port 3 and/or a USB-A port. In the above, the multiple interfaces of the expansion card 100 which serve as charging interfaces support multiple charging protocols, and for example, when the interface is a TYPE-C port, the TYPE-C port supports the PD (Power Delivery) power supply protocol. Specifically, the charging protocol is determined to be capable of satisfying charging requirements of various interfaces.

Preferably, two peripheral interfaces are provided in the present embodiment, and both of the peripheral interfaces are DC ports 1, and the two DC ports 1 output different voltages. They are respectively a DC port 1 that can output a voltage of 5V and a DC port 1 that can output a voltage of 12V.

Figure 6:
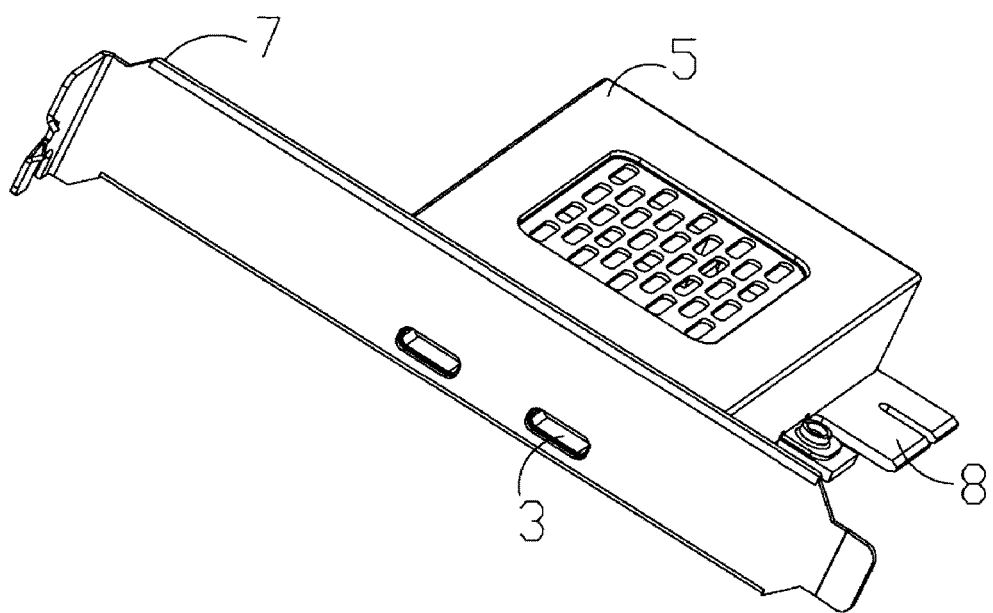
FIG. 6 is a schematic diagram of a second structure of an electrical power supply expansion card according to an embodiment of the present disclosure.
Figure 7:
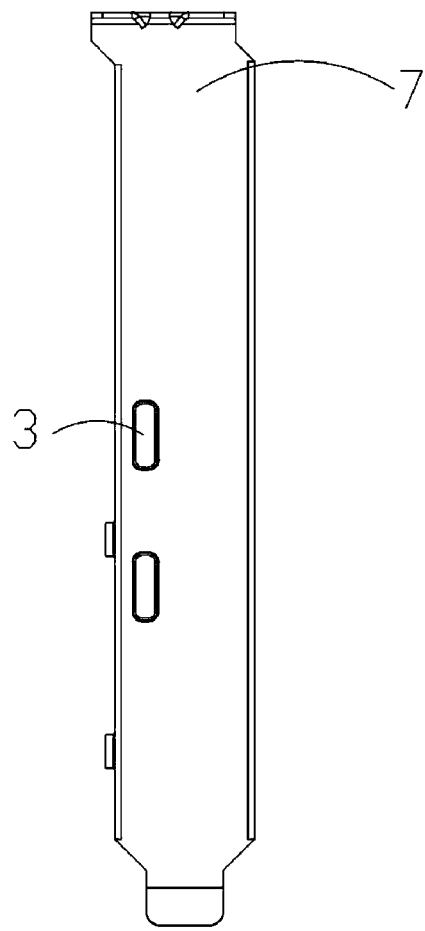
FIG. 7 is a left side view of FIG. 6.

It should be noted that, referring to FIG. 6 and FIG. 7, the direct current DC port 1 is modified to a TYPE-C port 3. When one of the peripheral interfaces is a TYPE-C port 3, a power source of a desktop computer is converted into a DC power source capable of charging a handheld device via the electrical power supply expansion card of the TYPE-C port, thereby improving the convenience and safety of a user's charging operation. Moreover, when one of the peripheral interfaces is the TYPE-C port 3, the PD power supply protocol developed based on the TYPE-C port can be added, thereby achieving a stronger power supply capability, accelerating charging of the handheld device, and improving the usability of the electrical power supply expansion card.

Further, the expansion card is provided with a 4 pin peripheral connector 2, and the 4 pin peripheral connector 2 is detachably connected to a 4 pin peripheral connector of the power source in the computer case through a power line, so that the expansion card 100 obtains electric power from the power source in the computer case. Specifically, the at least one power source interface in the present embodiment is a 4 pin peripheral connector 2, and different sockets of the 4 pin peripheral connector 2 are connected through the power lines to obtain different voltages. Preferably, the number of the 4 pin peripheral connectors 2 can be selected as needed. It should be noted that the at least one power source interface on the expansion card 100 may also be a 15 pin connector, and the 15 pin connector is detachably connected to a 15 pin connector of the power source in the computer case through a power line to obtain electric power from the power source in the computer case so as to obtain different output voltages. In practical applications, the type of the at least one power source interface can be selected and set according to actual needs.

Further, the expansion card is further provided with a reset switch 10, wherein the reset switch 10 is arranged on the circuit board, and located adjacent to a position where the at least one peripheral interface is located and protrudes from the plane of the fixing insertion plate 7. It can be understood that the reset switch 10 is mainly used to achieve an on/off state at the at least one peripheral interface, so that the user can control the connection and disconnection between the external device and the computer case by controlling the reset switch 10. Preferably, the expansion card 100 may be further provided with an indicator light, and the indicator light is arranged in the vicinity of the reset switch for displaying an on/off state of the reset switch 10, so that the user can more intuitively know the working state of the reset switch 10 by the display on the indicator light.

The present disclosure also provides a computer case comprising any one of the electrical power supply expansion cards described above. In the computer case in the present embodiment, the expansion card described above is adopted, and the expansion card 100 is used as an expanded power source of the power source in the computer case to supply power to external devices, thereby expanding the use function of the computer case. Other configurations and operations of the computer case according to the embodiment of the present disclosure are known to those of ordinary skill in the art and will not be described in detail herein. Specifically, since all the technical solutions of all the foregoing embodiments are adopted in this computer case, the computer case has at least all the beneficial effects brought by the technical solutions of the foregoing embodiments, which are not repeatedly described one by one herein.

The above description is only illustrative of preferred embodiments of the present disclosure, and is not intended to limit the scope of the present disclosure. Any equivalent structural variation made with the description and drawings of the present disclosure or direct/indirect application thereof in other related technical fields, within the inventive conception of the present disclosure, shall fall within the scope of protection of the present disclosure.

The invention claimed is:

1. An electric power supply expansion card, comprising a housing and a circuit board, wherein the circuit board is housed in the housing, and the housing is configured to be installed in a computer case; the circuit board is provided with at least one peripheral interface, the circuit board is further provided with at least one power source interface, and the at least one power source interface is detachably connected to a power source in the computer case so as to obtain electric power and output electric power via the at least one peripheral interface, wherein the at least one power source interface is a 4 pin peripheral connector or a 15 pin connector, the 4 pin peripheral connector or the 15 pin connector is detachably connected to the power source in the computer case through a power line, so that the expansion card obtains electric power;

the at least one peripheral interface is one or more of a DC port, a TYPE-C port, and a USB-A port, and the expansion card is further provided with a reset switch, and the reset switch is arranged on the circuit board and located adjacent to a position where the at least one peripheral interface is located and protrudes from a plane of the fixing insertion plate.

2. The electric power supply expansion card according to claim 1, wherein the housing comprises a fixing insertion plate, the fixing insertion plate and an output end of the at least one peripheral interface are on a same side, and the at least one peripheral interface extends outward in a direction perpendicular to a plane of the fixing insertion plate.

3. The electric power supply expansion card according to claim 2, wherein at least one end of the fixing insertion plate is provided with a mounting hole for allowing a screw to pass therethrough for fixing the expansion card to the computer case.

4. The electric power supply expansion card according to claim 1, wherein the housing further comprises a cover plate which is installed on the circuit board by a fixer.

5. The electric power supply expansion card according to claim 4, wherein an upper surface of the cover plate is provided with heat dissipating holes to dissipate heat from components on the circuit board.

6. The electric power supply expansion card according to claim 1, wherein the number of the at least one peripheral interface is two, and the two peripheral interfaces are DC ports for outputting different voltages, respectively.

7. A computer case, comprising an electric power supply expansion card, the electric power supply expansion card comprising a housing and a circuit board, wherein the circuit board is housed in the housing, and the housing is configured to be installed in the computer case; the circuit board is provided with at least one peripheral interface, the circuit board is further provided with at least one power source interface, and the at least one power source interface is detachably connected to a power source in the computer case so as to obtain electric power and output electric power via the at least one peripheral interface,
wherein the at least one power source interface is a 4 pin peripheral connector or a 15 pin connector, the 4 pin peripheral connector or the 15 pin connector is detachably connected to the power source in the computer case through a power line, so that the expansion card obtains electric power;
the at least one peripheral interface is one or more of a DC port, a TYPE-C port, and a USB-A port,
the expansion card is further provided with a reset switch, and the reset switch is arranged on the circuit board and located adjacent to a position where the at least one peripheral interface is located and protrudes from a plane of the fixing insertion plate.

8. The computer case according to claim 7, wherein the housing comprises a fixing insertion plate, the fixing insertion plate and an output end of the at least one peripheral interface are on a same side, and the at least one peripheral interface extends outward in a direction perpendicular to a plane of the fixing insertion plate.

9. The computer case according to claim 8, wherein at least one end of the fixing insertion plate is provided with a mounting hole for allowing a screw to pass therethrough for fixing the expansion card to the computer case.

10. The computer case according to claim 7, wherein the housing further comprises a cover plate which is installed on the circuit board by a fixer.

11. The computer case according to claim 10, wherein an upper surface of the cover plate is provided with heat dissipating holes to dissipate heat from components on the circuit board.

12. The computer case according to claim 7, wherein the number of the at least one peripheral interfaces is two, and the two peripheral interfaces are DC ports for outputting different voltages, respectively.

* * * * *